(12) United States Patent
Lin

(10) Patent No.: US 7,615,707 B2
(45) Date of Patent: Nov. 10, 2009

(54) PRINTED CIRCUIT BOARD AND FORMING METHOD THEREOF

(75) Inventor: Yung-Jen Lin, Taipei (TW)

(73) Assignee: Lite-On Technology Corp., Taipei (TW)

( * ) Notice: Subject to any disclaimer, the term of this patent is extended or adjusted under 35 U.S.C. 154(b) by 0 days.

(21) Appl. No.: 11/163,477

(22) Filed: Oct. 20, 2005

(65) Prior Publication Data
US 2006/0175085 A1    Aug. 10, 2006

(30) Foreign Application Priority Data
Feb. 4, 2005    (TW) ................ 94103652 A

(51) Int. Cl.
    *H05K 1/11*     (2006.01)
    *H01R 12/04*     (2006.01)

(52) U.S. Cl. .................... 174/262; 174/261; 29/832

(58) Field of Classification Search ............... 174/262, 174/263, 264, 265, 266, 250, 261; 361/792, 361/793, 794, 795; 439/65, 55
See application file for complete search history.

(56) References Cited

U.S. PATENT DOCUMENTS

| | | | | |
|---|---|---|---|---|
| 3,243,498 A | * | 3/1966 | Allen et. al. ............... | 174/266 |
| 4,787,853 A | * | 11/1988 | Igarashi .................. | 439/55 |
| 5,337,219 A | * | 8/1994 | Carr et al. ................ | 361/794 |
| 5,340,947 A | * | 8/1994 | Credle et al. .............. | 174/262 |
| 5,406,034 A | * | 4/1995 | Frei et al. ................. | 174/266 |
| 5,599,744 A | * | 2/1997 | Koh et al. ................. | 438/660 |
| 5,796,589 A | * | 8/1998 | Barrow .................... | 361/774 |
| 6,087,597 A | * | 7/2000 | Shimada et al. ............ | 174/263 |
| 6,107,109 A | * | 8/2000 | Akram et al. .............. | 438/15 |
| 6,127,736 A | * | 10/2000 | Akram ..................... | 257/780 |
| 6,199,273 B1 | * | 3/2001 | Kubo et al. ................ | 29/843 |
| 6,730,859 B2 | * | 5/2004 | Muramatsu et al. ......... | 174/262 |
| 6,833,615 B2 | * | 12/2004 | Geng et al. ................ | 257/698 |

FOREIGN PATENT DOCUMENTS

| | | |
|---|---|---|
| JP | S63-84979 | 6/1988 |
| JP | S64-50593 | 2/1989 |
| JP | H7-86727 | 3/1995 |
| JP | H7-211814 | 8/1995 |
| JP | 2000-156432 A | 6/2000 |
| JP | P2000-332111 A | 11/2000 |
| JP | 2005-19935 | 1/2005 |

* cited by examiner

*Primary Examiner*—Ishwar (I.B.) Patel
(74) *Attorney, Agent, or Firm*—Kile Goekjian Reed & McManus PLLC

(57) ABSTRACT

A printed circuit board and a forming method for forming the printed circuit board are disclosed. The printed circuit board includes a substrate and a conductive layer. The substrate includes a through hole, wherein one side of the through hole of the substrate corresponds to a first diameter, and the other side of the through hole of the substrate corresponds to a second diameter. The second diameter is greater than the first diameter. The conductive layer is placed on the inner surface of the through hole for electrically connecting the two sides of the substrate.

12 Claims, 4 Drawing Sheets

PRINTED CIRCUIT BOARD AND FORMING METHOD THEREOF

BACKGROUND OF THE INVENTION

1. Field of the Invention

The present invention relates to a printed circuit board, and more specifically, to a printed circuit board having a via and a forming method thereof.

2. Description of the Prior Art

Printed circuit boards are necessary components in the electronics industry, which can be applied to electronic products' motherboards for mounting other electronic components and providing wires to be utilized by other electronic components. Alternatively, a printed circuit board can be an adapter of a semi-product and mount the semi-product on a motherboard. Processing steps of a printed circuit board according to a related art include drilling, electroplating, wire etching, pressing, anti-soldering, tin-emitting etc. When a printed circuit board is utilized as an adapter, an application method of it is to drill and electroplate the adapter to form a via which is electrically connected between circuits on the front of the adapter and circuits on the back of the adapter. The front of the adapter is utilized for installing an application circuit, and the back of the adaptor adsorbs solder by using the via, in order for the application circuit to be mounted on the motherboard. In this way, the application circuit on the front of the adapter can be connected to circuit(s) on the motherboard using the via.

Sometimes, for protecting the application circuit from being oxidized or being destroyed by external factors, a method well known in the art is to packet and mold the application circuit. In order to prevent the compound(s) utilized during the molding process from flowing through the via to the back of the printed circuit board, it is necessary to manually seal a terminal of the via on the front of the printed circuit board with insulating stickers. Furthermore, when mounting the adapter on the motherboard, an insulating sticker can prevent the solder from flowing from the back of the printed circuit board to the front of the printed circuit board, so the application circuit will not short circuit. However, when the size of the via becomes very small, it is difficult to perform the above-mentioned operations manually. A method according to another related art is to fill a terminal of the via on the front of the printed circuit board with a blocking material, such as a solder mask, and at the same time, keep a terminal of the via on the back of the printed circuit board not filled, to adsorb the solder. However, the present method still has some limitations; for example, when the diameter of the via is too small, the terminal of the via on the back of the printed circuit board may not adsorb sufficient solder; when the diameter of the via is too large, the blocking material may sink causing the front of the printed circuit board to not be smooth, and furthermore, the filled blocking material may not bear the force from the molding process, causing the via to break and the compound to flow.

SUMMARY OF THE INVENTION

One of the objectives of the claimed invention is therefore to provide a printed circuit board and a forming method in order to resolve the above-mentioned problems.

According to the claimed invention, a printed circuit board (PCB) is disclosed. The printed circuit board comprises a substrate and a conductive layer. The substrate comprises a through hole. One side of the through hole of the substrate corresponds to a first diameter, and the other side of the through hole of the substrate corresponds to a second diameter, wherein the second diameter is greater than the first diameter. The conductive layer is placed on the surface of the through hole for electrically connecting the two sides of the substrate.

According to the claimed invention, a printed circuit board is disclosed. The printed circuit board comprises a substrate and a conductive layer. The substrate comprises a first surface, a second surface and a through hole. The through hole comprises a first part corresponding to a first diameter, wherein a first terminal of the first part is connected to the first surface; a second part corresponding to a second diameter and having a first terminal and a second terminal respectively connected to a second terminal of the first part and the second surface. The second diameter is greater than the first diameter. The conductive layer is placed on the inner surface of the through hole for connecting the first and the second surfaces.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
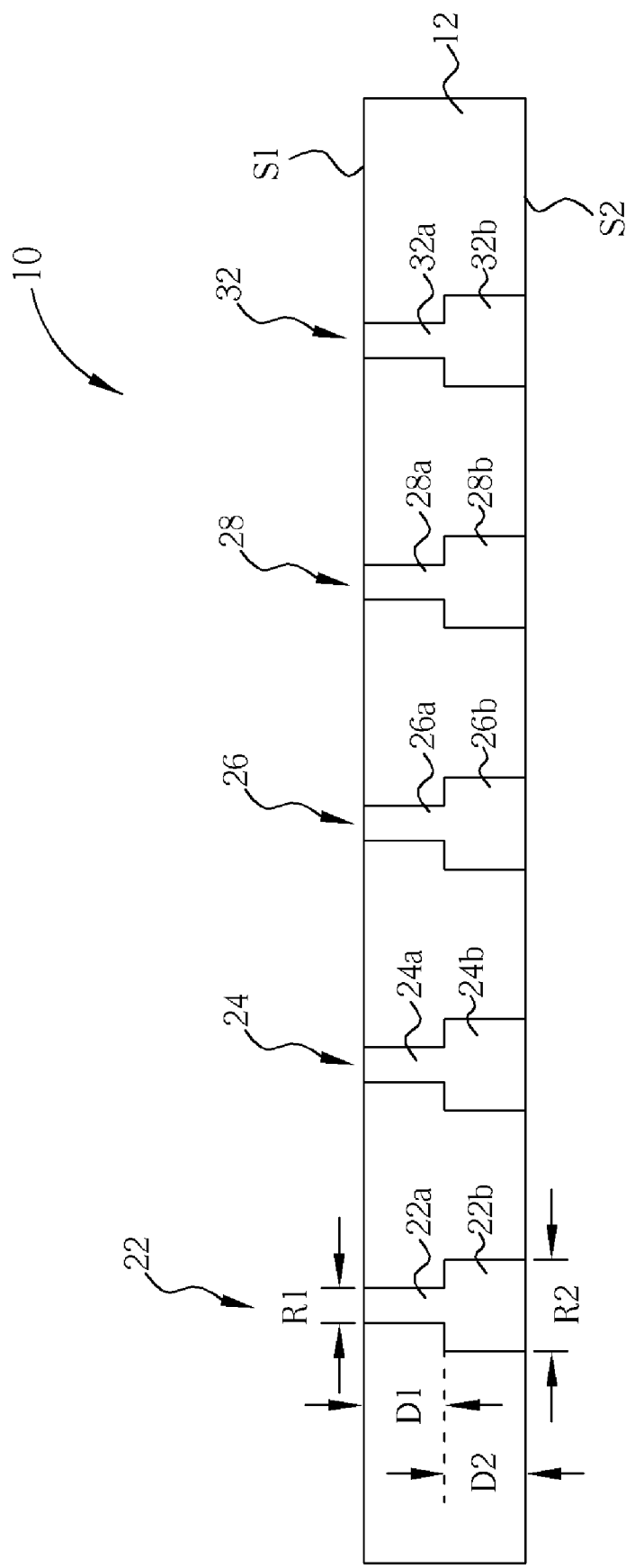
FIG. 1 is a cross-section diagram of a printed circuit board according to an embodiment of the present invention.

Please refer to FIG. 1. FIG. 1 is a cross-section diagram of a printed circuit board 10, according to an embodiment of the present invention. In the present embodiment, the printed circuit board 10 comprises a substrate 12 and a conductive layer. The substrate 12 comprises surfaces S1, S2 and a plurality of through holes 22, 24, 26, 28 and 32. The through holes 22, 24, 26, 28 and 32 can be divided into two parts, upper parts 22a, 24a, 26a, 28a, and 32a respectively, and lower parts 22b, 24b, 26b, 28b, and 32b respectively, according to diameters of the through holes 22, 24, 26, 28 and 32. Also, in the present embodiment, the upper parts 22a, 24a, 26a, 28a, 32a of the through holes 22, 24, 26, 28, 32 have the same diameters R1 and the same depths D1, and the lower parts 22b, 24b, 26b, 28b, 32b of the through holes 22, 24, 26, 28, 32 have the same diameters R2 and the same depths D2, wherein the diameter R2 is greater than the diameter R1. The detailed description of the functions and forms of the conductive layer is included in the following paragraph.

Figure 2:
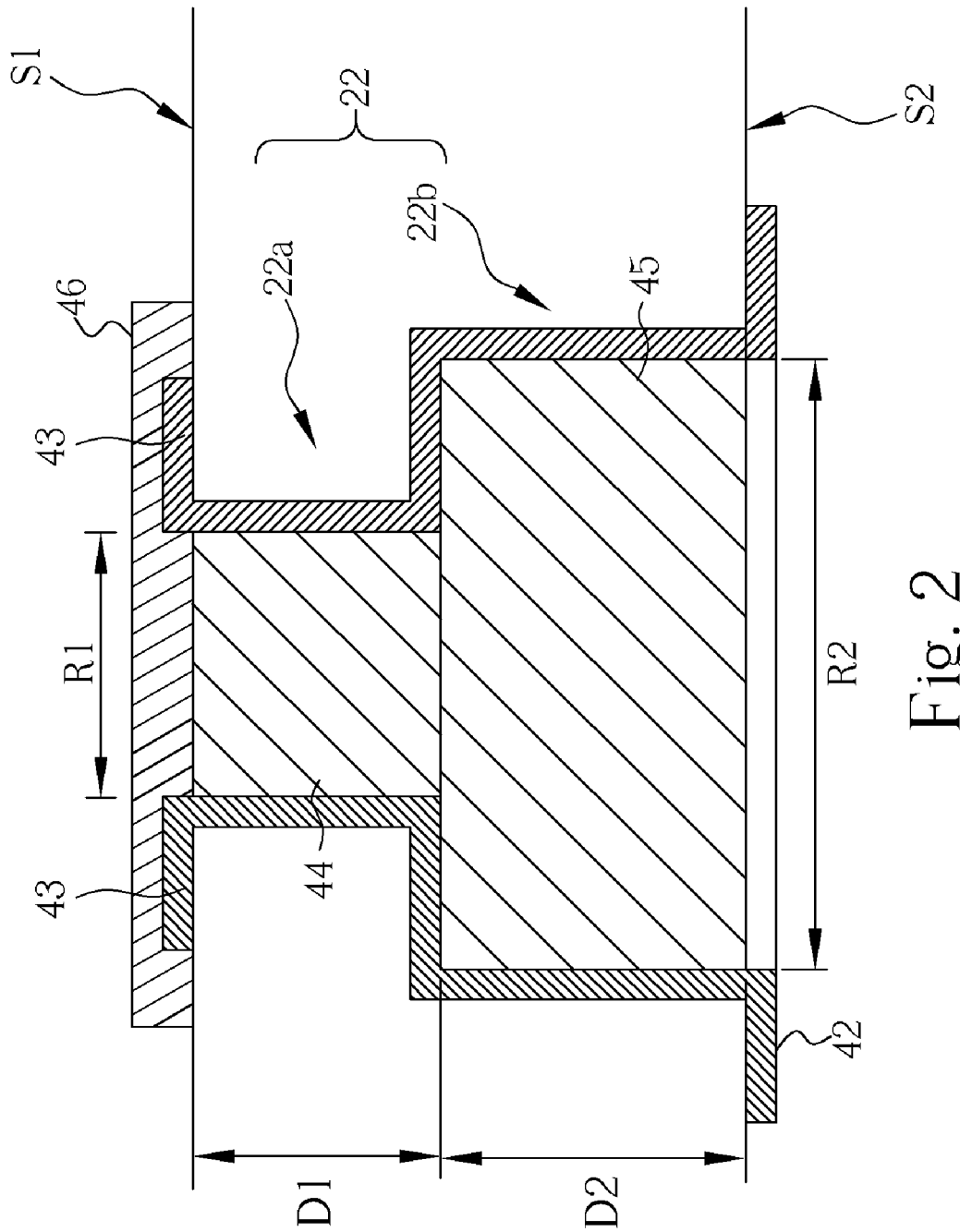
FIG. 2 is an enlarged diagram of a through hole shown in FIG. 1.

Please refer to FIG. 2. FIG. 2 is an enlarged diagram of the through hole 22 shown in FIG. 1. A conductive layer 42 is placed on the inner surface of the through hole 22 and parts of the through hole 22 connected to the surfaces S1, S2, to electrically connect the surfaces S1 and S2. A portion of the conductive layer 42 on the surface S1 acts as a metal ring 43 utilized for connecting surrounding circuit(s). The material of the conductive layer 42 can be copper or gold. Therefore, a via with electric properties is formed by the through hole 22 and the conductive layer 42. In the present embodiment, the conductive layer 42 is generated by electroplating. The upper part 22a of the through hole 22 is utilized for being filled with a blocking material 44, and the lower part 22b of the through hole 22 is not filled in order to allow adsorption of a metal conductor in a liquid state therein. After the metal conductor 45 in the liquid state cools, the metal conductor is attached onto the conductive layer 42 in order to mount the printed circuit board 10 on an electronic device. In the present embodiment, the blocking material 44 is a solder mask utilized for separating the surface S1 from the surface S2 and thus preventing any fluid materials from flowing from the surface S1 to the surface S2 or flowing from the surface S2 to the surface S1. In the present embodiment, the diameter R1 of the upper part 22a is 0.25 cm (centimeter), and the depth D1 of the upper part 22a is 0.1 cm. The diameter R2 of the lower part 22b is 0.5 cm, and the depth D2 of the lower part 22b is 0.7 cm. It should be noted that if the diameter R1 of the upper part 22a is too large, the blocking material 44 may sink and therefore the blocking effect may be affected. If the diameter R2 of the lower part 22b is too small or the depth D2 is not deep enough, the effect of the lower part 22b adsorbing the above-mentioned metal conductor may be affected. In addition, a terminal of the through hole 22 on the surface S1 is further covered by an anti-soldering material 46 to prevent the through hole 22 and a circuit (not shown) installed on the surface S1 from short circuiting. Please note that the anti-soldering material 46 utilized in the present embodiment is also the above-mentioned solder mask utilized to simplify the producing process; however, the anti-soldering material 46 and the blocking material 44 in the present invention can be implemented with different materials and are not limited to the materials utilized in the present embodiment. Moreover, a plurality of vias can be formed by using the through holes 24, 26, 28, 32 in conjunction with other conductive layers, and since the structures of the through holes 24, 26, 28, 32 are similar to the through hole 22, a description of the structures thereof is omitted here for the sake of brevity.

Figure 3:
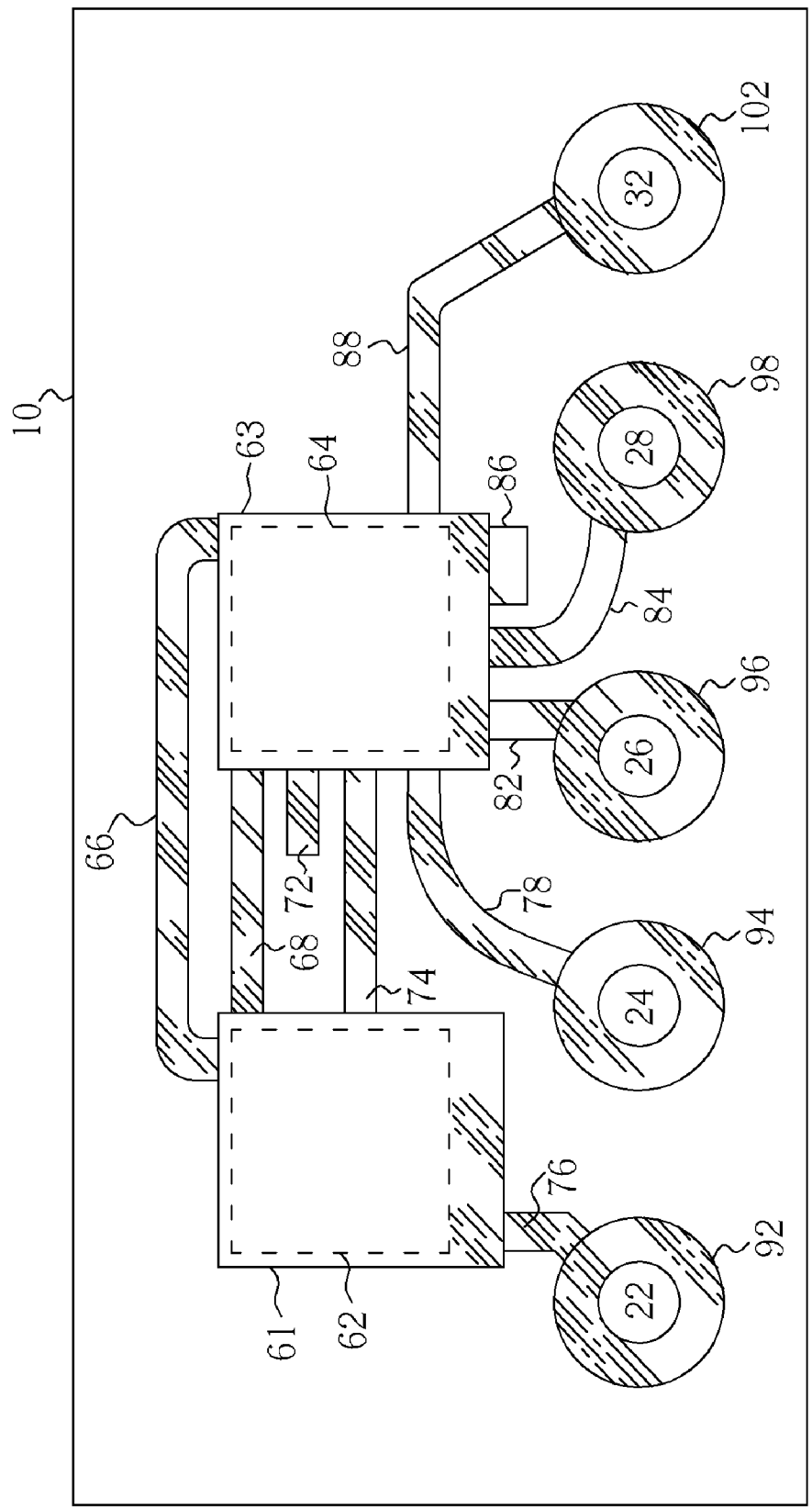
FIG. 3 is a front view of the printed circuit board shown in FIG. 1.

Please refer to FIG. 3. FIG. 3 is a front view of the printed circuit board 10 shown in FIG. 1. The metal rings 92, 94, 96, 98, 102 shown in FIG. 3 are parts of the conductive layer 42 on the surface S1 shown in FIG. 2 and are utilized for connecting the surrounding circuits. The front of the printed circuit board 10 (the surface S1 shown in FIG. 1) is utilized for having an application circuit placed on it. For this purpose, the surface S1 comprises a plurality of metal pads 62, 64 and a plurality of printed conducting wires 66, 68, 72, 74, 76, 78, 82, 84, 86 and 88. The metal pads 62, 64 are utilized for mounting electronic components 61, 63 of the above-mentioned application circuit, and the printed conducting wires 66, 68, 72, 74, 76, 78, 82, 84, 86, 88 are utilized for electrically connecting the above-mentioned electronic components 61, 63 and the metal rings 92, 94, 96, 98, 102 (vias corresponding to the through holes 22, 24, 26, 28, 32 respectively) to form the application circuit. In the present embodiment, after installing the application circuit, the printed circuit board 10 has to perform a molding process well known in the art. The upper parts 22a, 24a, 26a, 28a, 32a of the through holes 22, 24, 26, 28, 32 are filled with the blocking material, and therefore, although the compound utilized during the molding process is a fluid, the compound will not flow to the back of the printed circuit board 10 (the surface S2 shown in FIG. 1) through the through holes 22, 24, 26, 28, 32, keeping the printed circuit board 10 clean.

Figure 4:
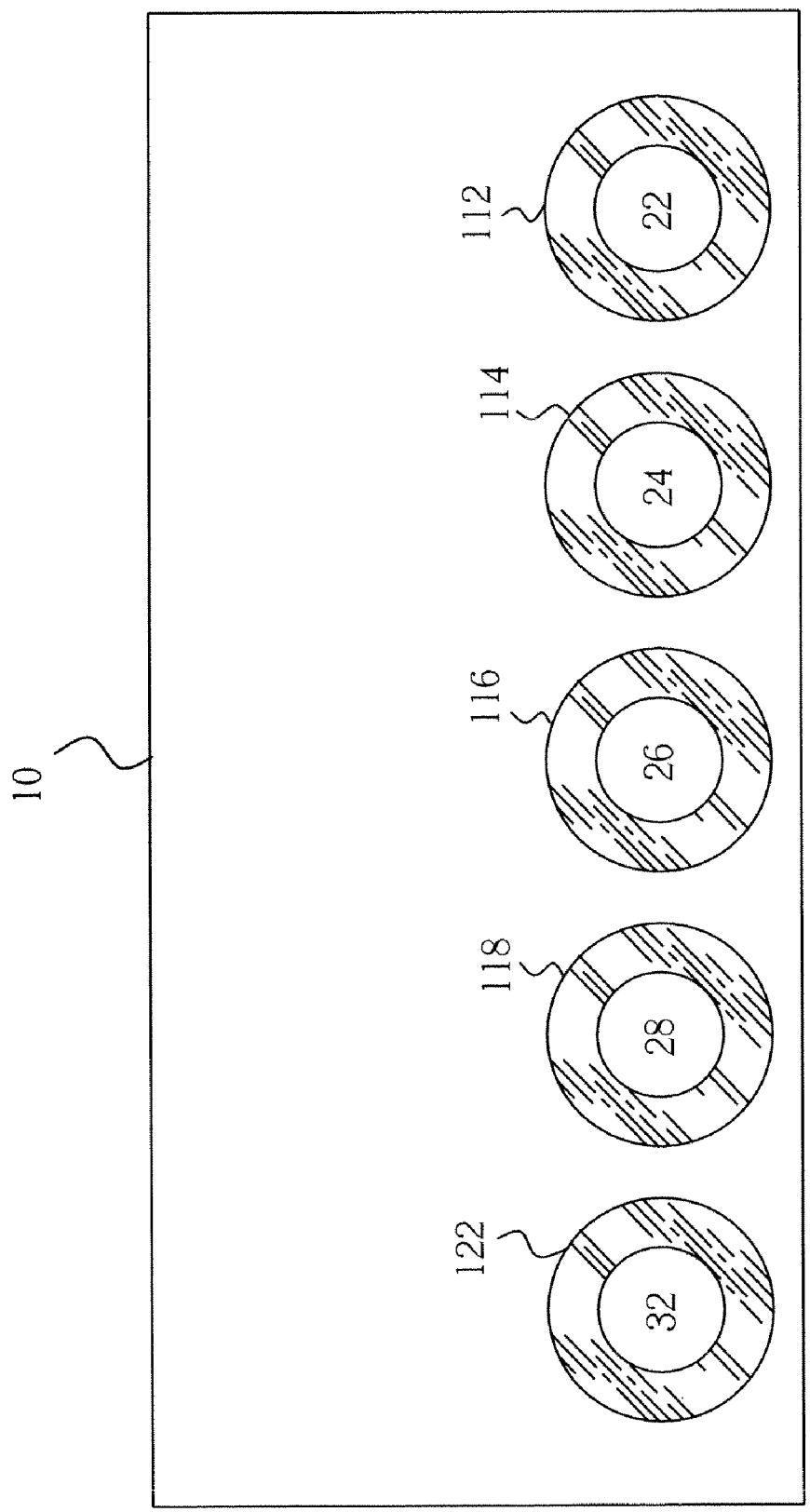
FIG. 4 is a back view diagram of the printed circuit board shown in FIG. 1.

Please refer to FIG. 4. FIG. 4 is a back view diagram of the printed circuit board 10 shown in FIG. 1. The metal rings 112, 114, 116, 118 and 122 shown in FIG. 4 are parts of the conductive layer 42 on the surface S2 shown in FIG. 2. In the present embodiment, the back of the printed circuit board 10 is utilized for being connected to a motherboard or other printed circuit boards of an electronic device. Therefore, the lower parts 22b, 24b, 26b, 28b, 32b of the through holes 22, 24, 26, 28, 32 have to remain open in order to adsorb a metal conductor in a liquid state (not shown). Since the upper parts 22a, 24a, 26a, 28a, 32a of the through holes 22, 24, 26, 28, 32 are filled with the blocking material, the solder will not flow to the front of the printed circuit board 10 through the through holes 22, 24, 26, 28, 32, preventing the application circuit on the front of the printed circuit board 10 from short circuiting. It should be noted that the diameters of the upper parts and the lower parts of the through holes may change according to characteristics of the blocking material or the metal conductor and are not limited to those in the above-mentioned embodiment. The through hole utilized in the present invention can even be a cone through hole. Any through hole with different diameters is covered in the present invention.

In contrast to the related art, the present invention installs a through hole with different diameters on the printed circuit board. Hence, the diameters of the through hole can be designed according to manufacturing or processing requirements of different layers of the printed circuit board.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A printed circuit board (PCB), comprising:
a substrate comprising a through hole, wherein one side of the through hole of the substrate corresponds to a first diameter, the other side of the through hole of the substrate corresponds to a second diameter, and the through hole comprises:
a first part corresponding to the first diameter; and
a second part corresponding to the second diameter;
a metal conductor, filled in the second part;
a blocking material, filled in the first part to separate a first surface of the substrate from a second surface of the substrate, wherein the blocking material filled in the first part is closer to the first surface than to the second surface, and the metal conductor filled in the second part is closer to the second surface than to the first surface;
a conductive layer comprising a first portion, a second portion, and a third portion, wherein the third portion is placed on an inner surface of the through hole, the first and second portions are placed on the first and second surfaces respectively, the first and second portions are both electrically connected to the third portion, and the first portion acts as a conductive ring;
an anti-soldering material placed on the blocking material and the conductive ring to cover the blocking material and the conductive ring completely, wherein the anti-soldering material does not cover an entire area of the first surface; and
at least an electronic component of an application circuit, mounted on the first surface and electrically connected to the first portion placed on the first surface;
wherein the second diameter is greater than the first diameter.

2. The printed circuit board of claim 1, wherein a material of the metal conductor is solder.

3. The printed circuit board of claim 1, wherein the blocking material is a solder mask.

4. A printed circuit board, comprising:
a substrate comprising a first surface, a second surface and a through hole; the through hole comprising:
a first part corresponding to a first diameter;

a second part corresponding to a second diameter and connected to the first part;

a metal conductor, filled in the second part;

a blocking material, filled in the first part to separate the first surface from the second surface, wherein the blocking material filled in the first part is closer to the first surface than to the second surface, and the metal conductor filled in the second part is closer to the second surface than to the first surface;

a conductive layer comprising a first portion, a second portion, and a third portion, wherein the third portion is placed on an inner surface of the through hole, the first and second portions are placed on the first and the second surfaces respectively, the first and second portions are both electrically connected to the third portion, and the first portion acts as a conductive ring;

an anti-soldering material placed on the blocking material and the conductive ring to cover the blocking material and the conductive ring completely, wherein the anti-soldering material does not cover an entire area of the first surface; and at least an electronic component of an application circuit, mounted on the first surface and electrically connected to the first portion placed on the first surface;

wherein the second diameter is greater than the first diameter.

5. The printed circuit board of claim 4, wherein a material of the metal conductor is solder.

6. The printed circuit board of claim 4, wherein the blocking material is a solder mask.

7. A method of forming a printed circuit board, comprising:
determining a first diameter corresponding to one side of a through hole according to characteristics of a blocking material;
determining a second diameter corresponding to the other side of the through hole, wherein the second diameter is greater than the first diameter;
providing a substrate having the through hole, wherein the through hole comprises:
a first part corresponding to the first diameter; and
a second part corresponding to the second diameter;
filling a metal conductor in the second part;
filling the blocking material in the first part to separate a first surface of the substrate from a second surface of the substrate, wherein the blocking material filled in the first part is closer to the first surface than to the second surface, and the metal conductor filled in the second part is closer to the second surface than to the first surface;
placing a first portion, a second portion, and a third portion of a conductive layer on the first surface of the substrate, the second surface of the substrate, and an inner surface of the through hole respectively, wherein the first and second portions are both electrically connected to the third portion, and the first portion acts as a conductive ring;
placing an anti-soldering material on the blocking material and the conductive ring to cover the blocking material and the conductive ring completely, wherein the anti-soldering material does not cover an entire area of the first surface; and
mounting at least an electronic component of an application circuit on the first surface and electrically connecting the electronic component to the first portion placed on the first surface.

8. The method of claim 7, wherein the step of determining the second diameter corresponding to the other side of the through hole comprises determining the second diameter according to characteristics of the metal conductor.

9. A method of forming a printed circuit board, comprising:
determining a first diameter corresponding to one side of a through hole;
determining a second diameter corresponding to the other side of the through hole according to characteristics of a metal conductor, wherein the second diameter is greater than the first diameter;
providing a substrate having the through hole, wherein the through hole comprises:
a first part corresponding to the first diameter; and
a second part corresponding to the second diameter;
filling a blocking material in the first part to separate a first surface of the substrate from a second surface of the substrate;
filling the metal conductor in the second part, wherein the blocking material filled in the first part is closer to the first surface than to the second surface, and the metal conductor filled in the second part is closer to the second surface than to the first surface;
placing a first portion, a second portion, and a third portion of a conductive layer on the first surface of the substrate, the second surface of the substrate, and an inner surface of the through hole respectively, wherein the first and second portions are both electrically connected to the third portion, and the first portion acts as a conductive ring;
placing an anti-soldering material on the blocking material and the conductive ring to cover the blocking material and the conductive ring completely, wherein the anti-soldering material does not cover an entire area of the first surface; and
mounting at least an electronic component of an application circuit on the first surface and electrically connecting the electronic component to the first portion placed on the first surface.

10. A method of forming a printed circuit board, comprising:
determining a first diameter corresponding to one side of a through hole according to characteristics of a blocking material;
determining a second diameter corresponding to the other side of the through hole, wherein the second diameter is greater than the first diameter;
providing a substrate having a first surface, a second surface and the through hole, the through hole comprising:
a first part corresponding to the first diameter;
a second part corresponding to the second diameter and connected to the first part;
filling a metal conductor in the second part;
filling the blocking material in the first part to separate the first surface from the second surface, wherein the blocking material filled in the first part is closer to the first surface than to the second surface, and the metal conductor filled in the second part is closer to the second surface than to the first surface;
placing a first portion, a second portion, and a third portion of a conductive layer on the first surface of the substrate, the second surface of the substrate, and the inner surface of the through hole respectively, wherein the first and second portions are both electrically connected to the third portion, and the first portion acts as a conductive ring;
placing an anti-soldering material on the blocking material and the conductive ring to cover the blocking material and the conductive ring completely, wherein the anti-soldering material does not cover an entire area of the first surface; and mounting at least an electronic component of an application circuit on the first surface and electrically connecting the electronic component to the first portion placed on the first surface.

11. The method of claim 10, wherein the step of determining the second diameter corresponding to the other side of the through hole comprises determining the second diameter according to characteristics of the metal conductor.

12. A method of forming a printed circuit board, comprising:
   determining a first diameter corresponding to one side of a through hole;
   determining a second diameter corresponding to the other side of the through hole according to characteristics of a metal conductor, wherein the second diameter is greater than the first diameter;
   providing a substrate having a first surface, a second surface and the through hole, the through hole comprising:
      a first part corresponding to the first diameter;
      a second part corresponding to the second diameter and connected to the first part;
   filling a blocking material in the first part to separate the first surface from the second surface;
   filling the metal conductor in the second part, wherein the blocking material filled in the first part is closer to the first surface than to the second surface, and the metal conductor filled in the second part is closer to the second surface than to the first surface;
   placing a first portion, a second portion, and a third portion of a conductive layer on the first surface of the substrate, the second surface of the substrate, and the inner surface of the through hole respectively, wherein the first and second portions are both electrically connected to the third portion, and the first portion acts as a conductive ring;
   placing an anti-soldering material on the blocking material and the conductive ring to cover the blocking material and the conductive ring completely, wherein the anti-soldering material does not cover an entire area of the first surface; and
   mounting at least an electronic component of an application circuit on the first surface and electrically connecting the electronic component to the first portion placed on the first surface.

* * * * *